United States Patent [19]

Enomoto et al.

[11] Patent Number: 4,952,883

[45] Date of Patent: Aug. 28, 1990

[54] PHASE DETECTOR CIRCUIT FOR PERIODIC SIGNAL USING THREE SAMPLING DATA

[75] Inventors: Akihiko Enomoto, Tokyo; Takashi Koga, Yokohama; Minoru Yoneda, Yokohama; Hiroshi Kobata, Yokohama, all of Japan

[73] Assignee: Kabushiki Kaisha Toshiba, Kawasaki, Japan

[21] Appl. No.: 314,118

[22] Filed: Feb. 23, 1989

[30] Foreign Application Priority Data

Feb. 29, 1988 [JP] Japan .................................. 63-44263

[51] Int. Cl.⁵ .......................... H03L 7/00; G01R 25/04
[52] U.S. Cl. ....................................... 328/159; 328/55; 328/155; 328/109; 377/43; 377/49; 307/514
[58] Field of Search ................. 328/159, 133, 55, 109, 328/155; 377/43, 49; 307/514

[56] References Cited

U.S. PATENT DOCUMENTS

| | | | |
|---|---|---|---|
| 3,431,405 | 3/1969 | Dawson | 328/159 |
| 3,735,273 | 5/1973 | Wright et al. | 328/159 |
| 3,987,422 | 10/1976 | Yanacidaira et al. | 377/43 |
| 4,291,332 | 9/1981 | Kato et al. | 358/19 |
| 4,404,583 | 9/1983 | Tatami | 358/13 |
| 4,617,679 | 10/1986 | Brooks | 307/514 |
| 4,675,724 | 6/1987 | Wagner | 358/19 |
| 4,751,565 | 6/1988 | Emmons et al. | 358/19 |
| 4,763,342 | 8/1988 | Ambrosio et al. | 377/43 |

FOREIGN PATENT DOCUMENTS 60-15190 4/1985 Japan .

*Primary Examiner*—John S. Heyman
*Attorney, Agent, or Firm*—Cushman, Darby & Cushman

[57] ABSTRACT

A phase detection circuit for detecting the phase shift of an input signal. An A/D converter converts the input signal into first, second and third digital data according to successive three sampling points. A first subtractor subtracts the third data from the second data to produce a first subtraction signal. A second subtractor subtracts the first data from the second data to produce a second subtraction signal. A third subtractor subtracts the second subtraction signal from the first subtraction signal to produce a signal representing the phase shift. An adder adds the first and second subtraction signals together to produce a signal representing the amplitude of the input signal. A converter converts the signal representing the phase shift into a signal representing the absolute value of the phase shift according to the signals representing the phase shift and the amplitude.

20 Claims, 4 Drawing Sheets

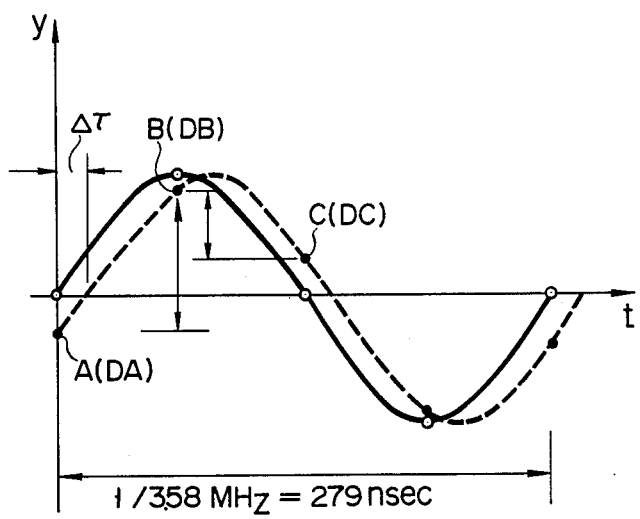
F I G. 4
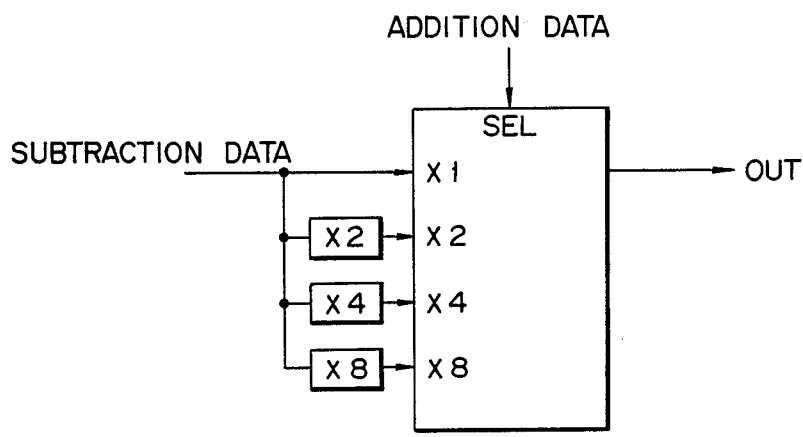
F I G. 5A
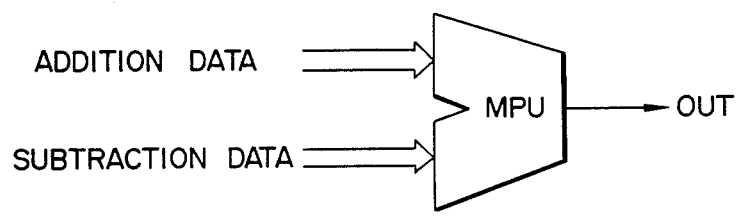
F I G. 5B

PHASE DETECTOR CIRCUIT FOR PERIODIC SIGNAL USING THREE SAMPLING DATA

BACKGROUND OF THE INVENTION

1. Field of the Invention

This invention relates to phase detection circuits, and more particularly to a phase detection circuit functioning as a time base corrector for correcting the phase shift caused by fluctuation in the time base of analog video signals.

2. Description of the Related Art

Video signal processing devices include video cassette recorders (VCR) using cassettes as recording media and laser disc devices using optical discs as recording media. While video information recorded on the recording medium is being reproduced, variations in the relative speed between the magnetic tape and the head in the VTR may occur. Likewise, in the laser disc device, variations in the relative speed between the pits recorded on the optical disc and the optical pickup may occur.

In order to precisely reproduce the recorded video signals, the video signal processing device generally includes a time base corrector. The time base corrector is divided into two types according to its correction process. One type of time base corrector performs the process of detecting the frequency and phase of a sync. signal included in the reproduced signal and mechanically controlling the rotation speed of the head, tape speed, or the rotation speed of the optical disc based on the detected frequency and phase. The other type of time base corrector effects the process of detecting the frequency and phase of a sync. signal included in the reproduced signal and electrically controlling the delay time of the reproduced signal itself.

The latter type time base corrector includes a triangular wave generation circuit for receiving a reference clock signal having a frequency of 3.58 MHz and generating a triangular wave signal for each period of the clock signal, and a phase comparator circuit for comparing the reference clock signal with a burst signal included in the input video signal to be phase-corrected. A sample-hold circuit samples the triangular wave signal and hold the signal level thereof in response to a sampling pulse which is generated from the phase comparator circuit according to the result of comparison. That is, the sample-hold circuit supplies an error voltage corresponding to the phase difference between the burst signal and the reference signal to a phase shifter circuit. Then, the time base variation of the input video signal can be corrected by the phase shifter circuit.

The conventional time base corrector uses a triangular wave having a frequency of 3.58 MHz. However, it is technically difficult to generate a triangular wave having such a high frequency at high precision, and therefore is becomes difficult to derive a precise error voltage. Further, the conventional time base corrector is sensitive to variations in the power source voltage and temperature variation, and the operation thereof is unstable.

SUMMARY OF THE INVENTION

An object of this invention is to provide a phase detector circuit capable of precisely detecting the phase shift even in the case of using a high frequency signal.

Another object of this invention is to provide a phase detector circuit which can effect the stable operation.

According to one aspect of this invention, there is provided a phase detection circuit for detecting the phase shift of an input signal which comprises A/D converting means for converting an input signal into first, second and third digital data according to successive three sampling points; first subtracter means connected to the A/D converting means, for subtracting the third data from the second data to produce a first subtraction signal representing a difference between the second and third data; second subtracter means connected to the A/D converting means, for subtracting the first data from the second data to produce a second subtraction signal representing a difference between the second and first data; and detection means connected to the first and second subtracter means, for detecting a signal representing the phase shift based on the first and second subtraction signals.

BRIEF DESCRIPTION OF THE DRAWINGS

The foregoing aspects and other features of the invention will be explained in the following description in connection with the accompanying drawings wherein:

FIGS. 3 and 4 are signal waveform diagrams illustrating the operation of the circuit shown in FIG. 2; and FIGS. 5A and 5B show other embodiments used instead of a ROM shown in FIG. 2.

DETAILED DESCRIPTION OF THE PREFERRED EMBODIMENTS

First, the time base corrector of a video signal processing device to which this invention can be applied is schematically explained with reference to FIG. 1.

Figure 1:
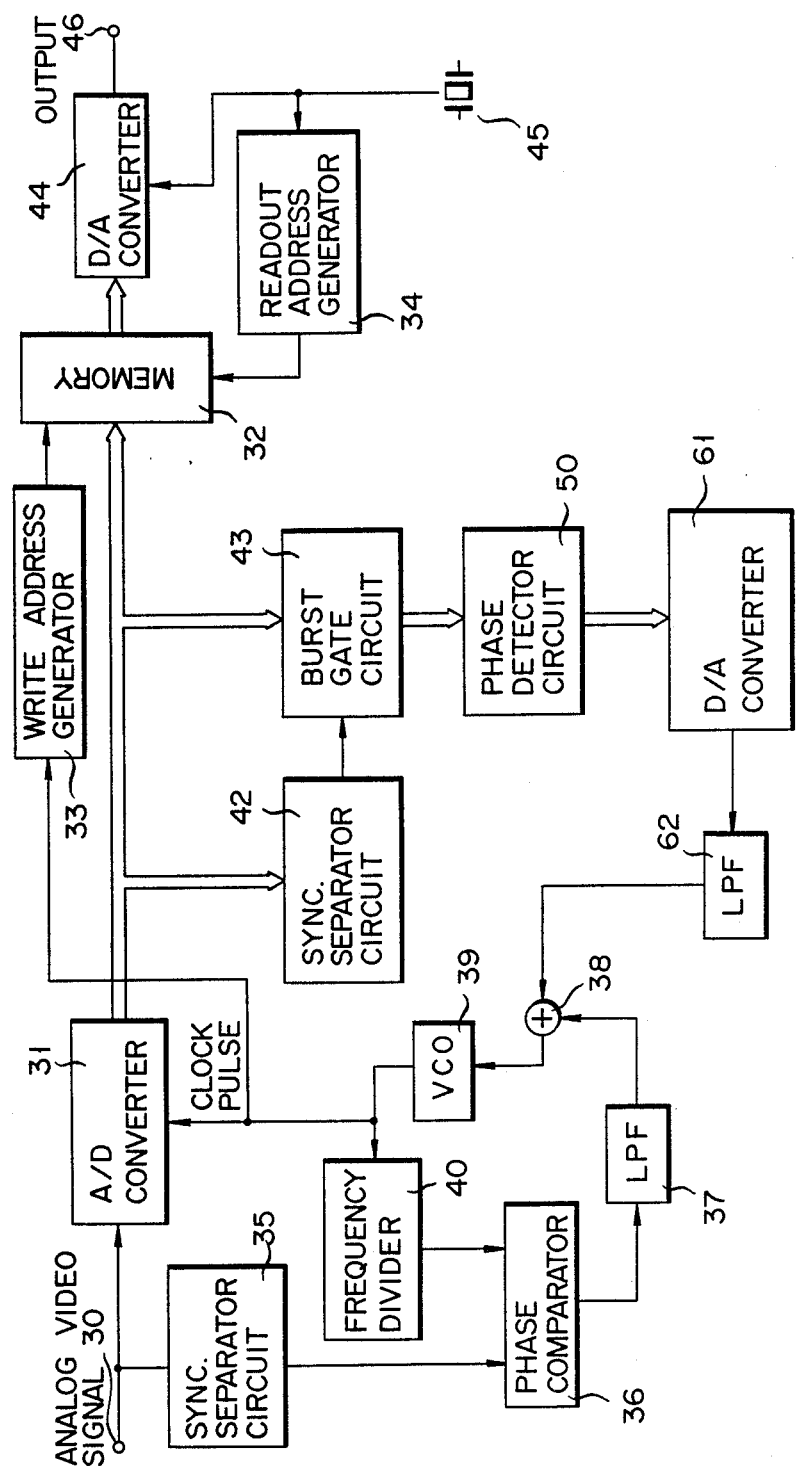
FIG. 1 is a block diagram schematically showing a time base corrector to which this invention can be applied.

As shown in FIG. 1, an analog video signal of NTSC, for example, is input to input terminal 30 and then supplied to A/D converter 31. A clock pulse used in the A/D converter is generated from voltage controlled oscillator (VCO) 39. When the time base of the analog video signal has varied, the phase of the clock pulse for the A/D converter is PLL-controlled according to the time base variation. As a result, the analog video signal is A/D converted according to the time base variation so that substantially the same digital signal as that which could be obtained by A/D converting the analog video signal having no time base variation can be derived. The digital video signal output from A/D converter 31 is stored in memory 32. Write address generator 33 generates a write address according to the time base variation in the analog video signal in order to control the write address of memory 32. Readout address generator 34 is driven by a stable clock pulse from crystal oscillator 45 in order to control the readout address of memory 32. A digital video signal read out is converted into an analog video signal by means of D/A converter 44 which is driven by a clock pulse from crystal oscillator 45, and is then supplied to output terminal 46.

Now, the PLL control is explained.

An analog video signal input to input terminal 30 is also supplied to sync. separator circuit 35. Sync. separator circuit 35 separates horizontal sync. signal HD from the analog video signal and supplied the same to phase comparator 36. A loop constituted by phase comparator 36, low-pass filter (LPF) 37, adder 38, voltage controlled oscillator (VCO) 39 and frequency divider 40 is closed to complete a phase locked loop (PLL). That is, phase comparator 36 compares the phase of sync. signal HD with the phase of a clock pulse supplied from VCO 39 via frequency divider 40. The phase difference output from phase comparator 36 is smoothed by means of LPF 37, and supplied to the frequency controlling terminal of VCO 39 via adder 38. In this way, the clock pulse from VCO 39 is phase-synchronized with the horizontal sync. signal of the analog video signal. In other words, in a case where the time base of the analog video signal varies and jitter occurs in the horizontal sync. signal of the analog video signal, the clock signal from VCO 39 varies accordingly.

As described above, the time base variation of the analog video signal can be corrected to some extent by the PLL control, and this invention is provided to further enhance the precision of correction.

Figure 2:
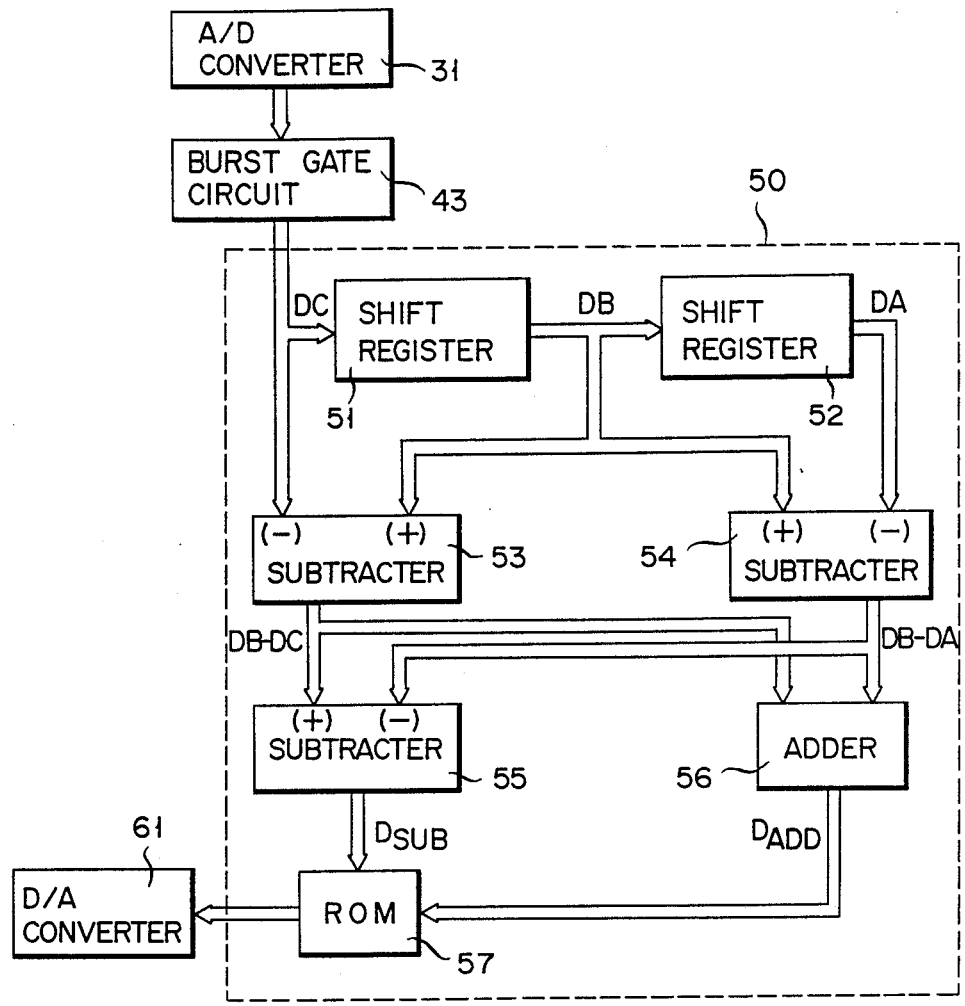
FIG. 2 is a circuit diagram showing a phase detector circuit according to one embodiment of this invention.

Now, this invention is described in more detail with reference to FIG. 2. The output of A/D converter 31 is supplied to burst gate circuit 43. In burst gate circuit 43, a digital burst gate signal is derived form the output. The output of A/D converter 31 is also supplied to sync. separator circuit 42 (FIG. 1). In sync. separator circuit 42, the sync. signal is separated from the output. The separated sync. signal is supplied as a burst flag to burst gate circuit 43 to control the gate timing thereof. The burst flag can also be derived from sync. separator circuit 35.

The derived digital burst signal is input to phase detector circuit 50 of this invention. As shown in FIG. 2, phase detector circuit 50 includes two shift registers 51 and 52. The digital burst signal is sequentially shifted by shift registers 51 and 52, and is output from each of the shift registers at preset timings. Assume now that three successive sampling points are sampled by A/D converter 31 with a phase difference of $\pi/2$. Further, assume that data DA, DB and DC are obtained at these successive sampling points in this time sequence. That is, data DA is stored in shift register 51 at the first timing. At the second timing, data DA is shifted to shift register 52 and at the same time data DB is stored in shift register 51. Then, at the third timing, data DA is supplied from shift register 52 to subtracter 54 and at the same time data DB is supplied from shift register 51 to subtracters 53 and 54 and data DC is input to subtracter 53. Subtracter 53 processes data DC and DB to produce the operation result (DB-DC). Further, subtracter 54 processes data DB and DA to produce the operation result (DB-DA). Then, the first operation result (DB-DC) and the second operation result (DB-DA) are respectively input to subtracter 55 and adder 56. Adder 56 performs the following operation to output information DADD concerning the amplitude of the analog video signal. Also, subtracter 55 performs the following operation to output information DSUB concerning the phase shift.

Now, DADD and DSUB are derived with reference to FIG. 4.

Since the burst signal is a sinusoidal wave, it can be expressed as follows:

$$y = a \sin(\omega t + \phi),$$

where $a$ is amplitude and $\phi$ is phase shift.

When the phase shift $\phi$ is expressed in terms of time variation $\tau$, the following equation can be obtained:

$$y = a \sin(\omega t + 2\pi(\tau/T)),$$

where T is a period of the 3.58 MHz signal (1/3.58 MHz = 279 nsec).

Since first, second and third sampling points A, B and C are respectively shifted by $\pi/2$, data DA, DB and DC corresponding to the sampling points can be expressed as follows.

$$
\begin{aligned}
DA &= a \sin 2\pi(\tau/T) \\
DB &= a \sin \{(\omega T/4) + 2\pi(\tau/T)\} \\
   &= a \sin \{(1/4) + (\tau/T)\} \\
DC &= a \sin \{(\omega T/2) + 2\pi(\tau/T)\} \\
   &= a \sin \{(1/2) + (\tau/T)\}
\end{aligned}
$$

Since addition result DADD is determined by the absolute value of DA, DB and DC, it can be derived as follows by taking the polarities thereof into consideration.

$$
\begin{aligned}
DADD &= -DA + DB + DB - DC \\
     &= a \sin 2\pi(\tau/T) + 2a \sin 2\pi\{(1/4) + (\tau/T)\} - \\
     &\quad a \sin 2\pi\{(1/2) + (\tau/T)\} \\
     &= 2a \sin 2\pi\{(1/4 + (\tau/T)\} - \\
     &\quad [a \sin 2\pi\{(1/2) + (\tau/T)\} + a \sin 2\pi(\tau/T)] \\
     &= 2a \sin 2\pi\{(1/4) + (\pi/T)\} - \\
     &\quad 2a \sin\{1/2 + (2\tau/T)\}\cos(\pi/T) \\
     &= 2a\{\sin(\pi/2)\cos(2\pi\tau/T)\} + \cos(\pi/2)\sin(2\pi\tau/T) \\
     &= 2a \cos(2\pi\tau/T)
\end{aligned}
$$

Likewise, subtraction result DSUB can be as follows.

$$
\begin{aligned}
DSUB &= -DA + DC \\
     &= a[\sin\{(1/2) + (\tau/T)\} - \sin 2\pi(\tau/T)] \\
     &= 2a \cos(1/2)\{\pi + (4\pi\tau/T)\sin(\pi/2) \\
     &= 2a \cos\{(\pi/2) + (2\pi\tau/T)\} \\
     &= 2a\{\cos(\pi/2)\cos(2\pi\tau/T) - \sin(\pi/2)\sin(2\pi\tau/T) \\
     &= -2a \sin(2\pi\tau/T)
\end{aligned}
$$

Now, the time variation $\tau$ is derived based on addition result DADD and subtraction result DSUB.

Since $DADD = 2a \cos(2\pi\tau/T)$ and $DSUB = -2a \sin(2\pi\tau/T)$, the following equation can be obtained.

$$
\begin{aligned}
a &= DADD/\{2a \cos(2\pi\tau/T)\} \\
  &= DSUB/\{-2a \sin(2\pi\tau/T)\}
\end{aligned}
$$

Based on the above equation, the following equations can be obtained.

$$-DADD \sin(2\pi\tau/T) = DSUB \cos(2\pi\tau/T)$$

$$
\begin{aligned}
-(DADD/DSUB) &= \{\sin(2\pi\tau/T)\}/\{\cos(2\pi\tau/T)\} \\
             &= \tan(2\pi\tau/T)
\end{aligned}
$$

Therefore, $\tau$ can be expressed as follows:

$$\tau = -(T/2\pi) \tan^{-1}(DADD/DSUB)$$

Therefore, if $\tau$ is previously stored in a read only memory (ROM), the amount of phase shift can be detected as the absolute value of the phase shift by using the subtraction result and the addition result.

Next, this invention is explained in more detail with reference to FIGS. 3 and 4.

Figure 3:
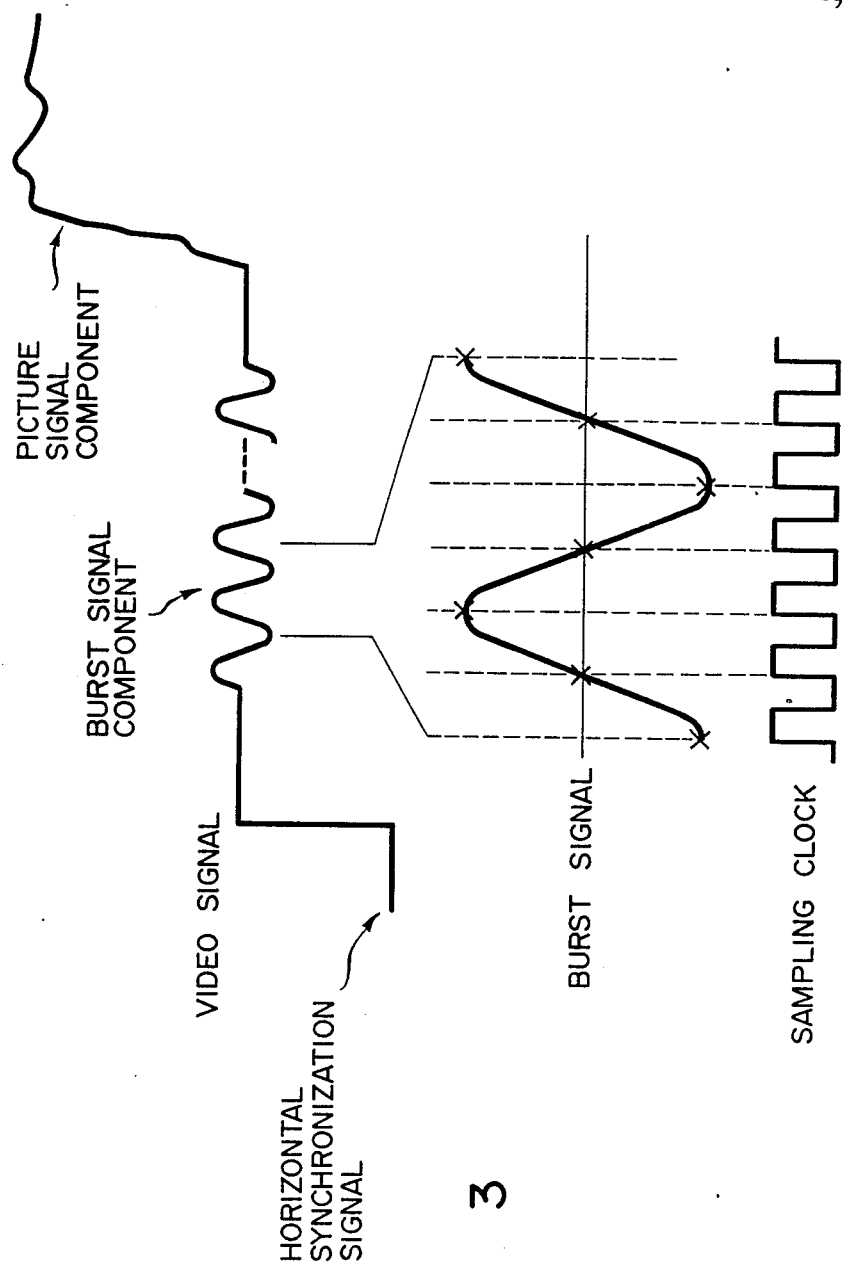

FIG. 3 shows a case wherein the burst signal included in an analog video signal is sampled in an ideal condition in which no time base variation occurs. As is clearly seen from FIG. 3, in this case, the zero-cross points and peak points (indicated by x mark in FIG. 3) of the burst signal are sampled in response to the rise of the sampling clock so that no relative time base variation will occur between the burst signal and the clock pulse.

The ideal sampling points are indicated by circle (o) marks on the burst signal in FIG. 4. When the time base of the analog video signal has varied and if the clock pulse phase is not adjusted, points on the burst signal indicated by dot (·) marks in FIG. 4 will be sampled.

Now, suppose that DADD is derived based on data DA, DB and DC corresponding to sampling points A, B and C which have a phase difference of $\pi/2$. As described before, $DADD = 2a \cos(2\pi\tau/T)$. Therefore, when no time base variation occurs, $DADD = (2\pi\tau/T) \cos 0° = 2a$ and information concerning the amplitude of the burst signal can be derived. In other words, when DA and DC are on the t axis, the amplitude will be 2DB. If the time base has varied and sampling points A and C are shifted, the value of $\cos(2\pi\tau/T)$ becomes smaller than 1, causing DAA to be smaller than 2DB.

Further, as described before, $DSUB = -2a \sin(2\pi\tau/T)$. With no time base variation, $DSUB = -2a \sin(2\pi\tau/T) = -2a \sin 0° = 0$. This means that there is no phase shift in the burst signal. If there is a phase shift, DSUB takes a value other than 0 and the value represents the amount of phase shift.

DSUB and DADD obtained are supplied to ROM 57. A phase detection output is derived from ROM 57 as the absolute value of the phase shift corresponding to DSUB. In this case, the values of DSUB and DADD are used as the lower and upper addresses of ROM 57. In this embodiment, ROM 57 is used, but other converters may be used to serve the same purpose. For example, a selector shown in FIG. 5A or a microprocessor unit (MPU) shown in FIG. 5B may be used. In a case where the selector is used, subtraction data is varied according to addition data to attain the approximation of a phase shift signal.

The phase detection output from phase detection circuit of this invention is supplied to D/A converter 61. Analog information concerning the phase shift correction amount can be derived from D/A converter 61. Further, the low frequency components of the analog information is extracted by means of LPF 62 and supplied to adder 38.

The correction outputs from LPFs 37 and 62 are added together in adder 38 which in turn supplies the result of addition to VCO 39. In this way, the PLL including VCO 3 performs the phase synchronization with respect to the horizontal sync. signal and the phase synchronization with respect to the burst signal (low frequency components).

As described above, since the clock pulse generated from VCO 39 and used for the sampling operation in the D/A converter 4 is precisely adjusted according to variations in the input analog video signal, the analog signal can be sampled as if it were not subject to the time base variation.

The digital video signal subjected to the A/D conversion is stored in memory 32, and in this case the address of memory 32 is determined by address generation circuit 33 which is driven in response to the output of VCD 39. The operation of reading out the digital video signal and D/A converting the digital video signal by use of D/A converter 44 is effected based on the reference clock from crystal oscillator 45. Therefore, it becomes possible to derive an output video signal with respect to the input analog video signal whose time base variation is corrected. In this embodiment, this invention is applied to the time base corrector of the video signal processing device. However, this invention is not limited to this embodiment, and can be used in other devices for detecting the phase lead and lag in a periodic signal, for example. The application range thereof can be further widened by changing data stored in ROM 57 according to how the phase detection output is used.

What is claimed is:

1. A phase detection circuit for detecting the phase shift of an analog input signal subject to sampling, comprising:
    analog-to-digital converting means for converting the analog input signal into first, second and third digital data according to successive three different sampling points;
    first subtracter means connected to said analog-to-digital converting means, for subtracting the third data from the second data to produce a first subtraction signal representing a difference between the second and third data;
    second subtracter means connected to said analog-to-digital converting means, for subtracting the first data from the second data to produce a second subtraction signal representing a difference between the second and first data; and
    detection means connected to said first and second subtracter means, for detecting a signal representing the phase shift based on the first and second subtraction signals.

2. A circuit according to claim 1, further comprising means, coupled to said analog-to-digital converting means, for storing the digital data and for supplying it to said first and second subtracter means.

3. A circuit according to claim 2, wherein said storing means includes a shift register.

4. A circuit according to claim 1, wherein said detection means includes means for adding the first and second subtraction signals to produce a signal representing an amplitude of the input signal, and means for subtracting the second subtraction signal from the first subtraction signal to produce a signal representing the phase shift.

5. A circuit according to claim 1, further comprising converter means for converting the signal representing the phase shift and producing a signal representing an absolute value of the phase shift.

6. A circuit according to claim 5, wherein said converter means includes a read only memory.

7. A circuit according to claim 5, wherein said converter means includes a selector.

8. A circuit according to claim 5, wherein said converter means includes a microprocessor unit.

9. A time base corrector device for correcting the phase shift of an analog input signal subject to sampling, comprising:

analog-to-digital converting means for converting the input signal into first, second and third digital data according to successive three different sampling points;

first subtracter means connected to said analog-to-digital converting means, for subtracting the third data from the second data to produce a first subtraction signal representing a difference between the second and first data;

second subtracter means connected to said analog-to-digital converting means, for subtracting the first data from the second data to produce a first subtraction signal representing a difference between the second and third data;

third subtracter means connected to said first and second subtracter means, for subtracting the second subtraction signal from the first subtraction signal to produce a signal representing the phase shift;

adding means connected to said first and second subtracter means, for adding the first and second subtraction signals together to produce a signal representing an amplitude of the input signal;

converter means connected to said third subtracter means and adding means, for converting the signal representing the phase shift into a signal representing an absolute value of the phase shift according to the signals representing the phase shift and the amplitude; and correction means connected to said converter means and analog-to-digital converting means, for correcting the phase shift according to the signal representing the absolute value.

10. A device according to claim 9, further comprising means, coupled to said analog-to-digital converting means, for storing the digital data and of supplying it to said first and second subtracter means.

11. A device according to claim 10, wherein said storing means includes a shift register.

12. A device according to claim 9, wherein said converter means includes a read only memory.

13. A device according to claim 9, wherein said converter means includes a selector.

14. A device according to claim 9, wherein said converter means includes a microprocessor unit.

15. A phase detection circuit for detecting the phase shift of an analog input signal subject to sampling, comprising:

analog-to-digital converting means for converting the input signal into first, second and third digital data according to successive three different sampling points;

first subtracter means connected to said analog-to-digital converting means, for subtracting the third data from the second data to produce a second subtraction signal representing a difference between the second and first data;

second subtracter means connected to said analog-to-digital converting means, for subtracting the first data from the second data to produce a second subtraction signal representing a difference between the second and first data;

third subtracter means connected to said first and second subtracter means, for subtracting the second subtraction signal from the first subtraction signal to produce a signal representing the phase shift;

adding means connected to said first and second subtracter means, for adding the first and second subtraction signals together to produce a signal representing an amplitude of the input signal; and converter means connected to said third subtracter means and adding means, for converting the signal representing the phase shift into a signal representing an absolute value of the phase shift according to the signals representing the phase shift and the amplitude.

16. A circuit according to claim 15, further comprising means, coupled to said analog-to-digital converting means, for storing the digital data and for supplying it to said first and second subtracter means.

17. A circuit according to claim 16, wherein said storing means includes a shift register.

18. A circuit according to claim 15, wherein said converter means includes a read only memory.

19. A circuit according to claim 15, wherein said converter means includes a selector.

20. A circuit according to claim 15, wherein said converter means includes a microprocessor unit.

* * * * *